US008760917B2

(12) United States Patent
Lusetsky (10) Patent No.: US 8,760,917 B2
(45) Date of Patent: Jun. 24, 2014

(54) NON-VOLATILE MEMORY CELL WITH HIGH BIT DENSITY

(75) Inventor: Igor Lusetsky, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 149 days.

(21) Appl. No.: 13/556,810

(22) Filed: Jul. 24, 2012

(65) Prior Publication Data

US 2014/0029354 A1    Jan. 30, 2014

(51) Int. Cl.
*G11C 16/04*        (2006.01)

(52) U.S. Cl.
USPC .... 365/185.01; 365/149; 365/51; 365/185.27

(58) Field of Classification Search
USPC ............. 365/185.01, 185.27, 51, 63, 149; 257/315–316, E21.179
See application file for complete search history.

(56) References Cited

U.S. PATENT DOCUMENTS

| 6,678,190 | B2 | 1/2004 | Yang et al. |
| 7,652,917 | B2 * | 1/2010 | Oka et al. ................. 365/185.01 |
| 7,768,059 | B2 | 8/2010 | Chen et al. |

* cited by examiner

*Primary Examiner* — David Lam
(74) *Attorney, Agent, or Firm* — Ditthavong Mori & Steiner, P.C.

(57) ABSTRACT

A non-volatile memory cell with high bit density is disclosed. Embodiments include: providing a transistor having a wordline gate structure over a substrate, first and second floating gate structures proximate opposite sides of the wordline gate structure, and first and second diffusion regions in the substrate, wherein the wordline gate structure, the first floating gate structure, and the second floating gate structure are laterally between the first and second diffusion regions; and providing a capacitor having first, second, and third control gate structures over the substrate, a third floating gate structure between the first and second control gate structures, a fourth floating gate structure between the second and third control gate structures, and third and fourth diffusion regions in the substrate, wherein the first, second, and third control gate structures are laterally between the third and fourth diffusion regions.

20 Claims, 10 Drawing Sheets

NON-VOLATILE MEMORY CELL WITH HIGH BIT DENSITY

TECHNICAL FIELD

The present disclosure relates to non-volatile memory (NVM) cells. The present disclosure is particularly applicable to NVM cells with high bit density.

BACKGROUND

Figure 1:
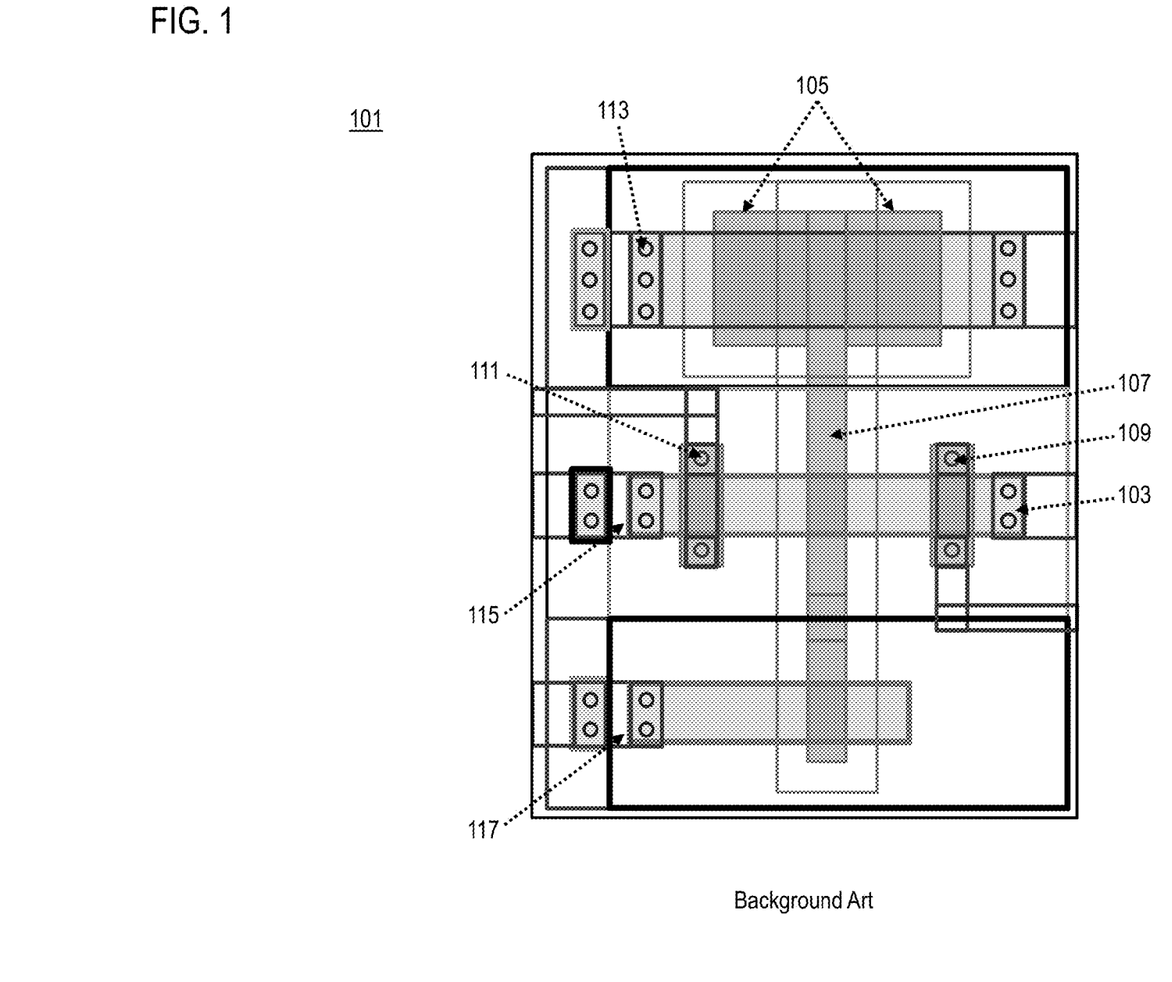
FIG. 1 schematically illustrate a typical NVM cell having low bit density.

Traditionally, fast write and erase speeds associated with embedded NVM technologies rely on processes utilizing a high number of masks and complex integrations with high-voltage MOSFETs (metal-oxide-semiconductor field-effect transistors) devices such as LDMOS (laterally diffused metal oxide semiconductor) devices. Although device manufacturers have produced embedded NVM devices using fewer masks and simpler integration processes, each of these NVM devices suffers from at least one of relatively large cell size, low bit density, slow write speeds, and no erase functions (e.g., one-time programming (OTP) only). In addition, such NVM devices may require LDMOS devices along with the standard logic CMOS (complementary MOS) flow. As an example, FIG. 1 illustrates memory cell 101 that includes only one bitline (e.g., NMOS bitline 103) along with its other components, such as control gate structures 105, floating gate structure 107, wordline gate structure 109, select gate structure 111, control gate line 113, NMOS select line 115, and PMOS select line 117. Consequently, devices based on memory cell 101 may exhibit low bit density and large device size, among other disadvantages.

A need therefore exists for more efficient and effective NVM cells that are smaller in size, enable fast write and erase operations, have high bit density, and do not require LDMOS devices, and enabling methodology.

SUMMARY

An aspect of the present disclosure is a method for implementing a NVM cell with high bit density.

Another aspect of the present disclosure is a NVM cell with high bit density.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a transistor having a wordline gate structure over a substrate, first and second floating gate structures proximate opposite sides of the wordline gate structure, and first and second diffusion regions in the substrate, wherein the wordline gate structure, the first floating gate structure, and the second floating gate structure are laterally between the first and second diffusion regions; and providing a capacitor having first, second, and third control gate structures over the substrate, a third floating gate structure between the first and second control gate structures, a fourth floating gate structure between the second and third control gate structures, and third and fourth diffusion regions in the substrate, wherein the first, second, and third control gate structures are laterally between the third and fourth diffusion regions.

Aspects include coupling the transistor and the capacitor via the first and third floating gate structures, and via the second and fourth floating gate structures. Other aspects include the first floating gate structure being the third floating gate structure, and the second floating gate structure being the fourth floating gate structure.

Additional aspects include providing a write operation by: positively biasing the wordline gate structure and one of the first and second diffusion regions; coupling another one of the first and second diffusion regions to a ground rail; and positively biasing the first, second, and third control gate structures, and the third and fourth diffusion regions. Certain aspects include positively biasing the one of the first and second diffusion regions, the first, second, and third control gate structures, and the third and fourth diffusion regions by applying a programming drain voltage to the one of the first and second diffusion regions, the first, second, and third control gate structures, and the third and fourth diffusion regions.

Further aspects include providing an erase operation by: negatively biasing the wordline gate structure, the first, second, and third control gate structures, and the third and fourth diffusion regions; positively biasing one of the first and second diffusion regions; and floating another one of the first and second diffusion regions. Some aspects include: negatively biasing the wordline gate structure, the first, second, and third control gate structures, and the third and fourth diffusion regions by applying an erase wordline voltage to the wordline gate structure, the first, second, and third control gate structures, and the third and fourth diffusion regions; and positively biasing the one of the first and second diffusion regions by applying an erase drain voltage to the one of the first and second diffusion regions. Various aspects include providing an erase operation by: coupling the wordline gate structure, the first, second, and third control gate structures, and the first and second diffusion regions to a ground rail; and positively biasing the third and fourth diffusion regions.

An additional aspect of the present disclosure is a device including: a transistor having a wordline gate structure over a substrate, first and second floating gate structures proximate opposite sides of the wordline gate structure, and first and second diffusion regions in the substrate, wherein the wordline gate structure, the first floating gate structure, and the second floating gate structure are laterally between the first and second diffusion regions; and a capacitor having first, second, and third control gate structures over the substrate, a third floating gate structure between the first and second control gate structures, a fourth floating gate structure between the second and third control gate structures, and third and fourth diffusion regions in the substrate, wherein the first, second, and third control gate structures are laterally between the third and fourth diffusion regions.

Aspects include the transistor being coupled to the capacitor via the first and third floating gate structures, and via the second and fourth floating gate structures. Other aspects include the first floating gate structure being the third floating gate structure, and the second floating gate structure being the fourth floating gate structure.

Another aspect includes a device having the transistor and the capacitor being configured to provide a write operation via: positive biasing of the wordline gate structure and one of the first and second diffusion regions; coupling of another one of the first and second diffusion regions to a ground rail; and positive biasing of the first, second, and third control gate structures, and the third and fourth diffusion regions. Some aspects include a device having the transistor and the capacitor being configured to provide an erase operation via: negative biasing of the wordline gate structure, the first, second, and third control gate structures, and the third and fourth diffusion regions; positive biasing of one of the first and second diffusion regions; and floating of another one of the first and second diffusion regions. Various aspects include a device having the transistor and the capacitor being configured to provide an erase operation via: coupling of the wordline gate structure, the first, second, and third control gate structures, and the first and second diffusion regions to a ground rail; and positive biasing of the third and fourth diffusion regions.

Further aspects include a device having: a shallow trench isolation (STI) region that separates the transistor and the capacitor; a plurality of source/drain extension regions in the substrate laterally between the first and second diffusion regions; a plurality of halo implant regions respectively proximate sides of the source/drain extension regions. Certain aspects include a device having a set of spacers between each of the wordline gate structure and the first floating gate structure, the wordline gate structure and the second floating gate structure, the first control gate structure and the third floating gate structure, the second control gate structure and the third floating gate structure, the second control gate structure and the fourth floating gate structure, and the third control gate structure and the fourth floating gate structure, wherein each set of spacers include one spacer that is formed of nitride, and another spacer that is formed of oxide.

Another aspect of the present disclosure is a method including: providing first and second floating gate structures over first and second well regions in a substrate; providing a transistor having a wordline gate structure over the first well region, the first and second floating gate structures proximate opposite sides of the wordline gate structure, and first and second diffusion regions in the first well region, wherein the wordline gate structure, the first floating gate structure, and the second floating gate structure are laterally between the first and second diffusion regions; and providing a capacitor having first, second, and third control gate structures over the second well region, the first floating gate structure between the first and second control gate structures, the second floating gate structure between the second and third control gate structures, and third and fourth diffusion regions in the second well region, wherein the first, second, and third control gate structures are laterally between the third and fourth diffusion regions.

Further aspects include the transistor and the capacitor being configured to provide a write operation via: application of a positive wordline voltage to the wordline gate structure; application of a positive programming drain voltage to one of the first and second diffusion regions; coupling of another one of the first and second diffusion regions to a ground rail; and application of the positive programming drain voltage to the first, second, and third control gate structures, and the third and fourth diffusion regions. Certain aspects include the transistor and the capacitor being further configured to provide an erase operation via: application of a negative erase wordline voltage to the wordline gate structure, the first, second, and third control gate structures, and the third and fourth diffusion regions; application of a positive erase drain voltage to the one of the first and second diffusion regions; and floating of the other one of the first and second diffusion regions. Other aspects include the transistor and the capacitor being further configured to provide another erase operation via: coupling of the wordline gate structure, the first, second, and third control gate structures, and the first and second diffusion regions to the ground rail; and application of a positive erase drain voltage to the third and fourth diffusion regions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 2A schematically illustrates a layout view, and FIGS. 2B and 2C schematically illustrate cross-sectional views of a transistor and a capacitor, respectively, of a NVM cell with high bit density, in accordance with exemplary embodiments of the present disclosure.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of large cell size, slow write operations, low bit density, absence of erase operations, and reliance on LDMOS devices attendant upon current methods of forming NVM cells. The present disclosure addresses and solves such problems, for instance, by, inter alia, providing a transistor having diffusion regions in a substrate, a wordline gate structure over the substrate, and floating gate structures that are proximate opposite sides of the wordline gate structure and laterally between the diffusion regions; and providing a capacitor having other diffusion regions in the substrate, control gate structures that overlie the substrate and that are laterally between the other diffusion regions, and other floating gate structures that are laterally between the control gate structures.

Figure 2A:
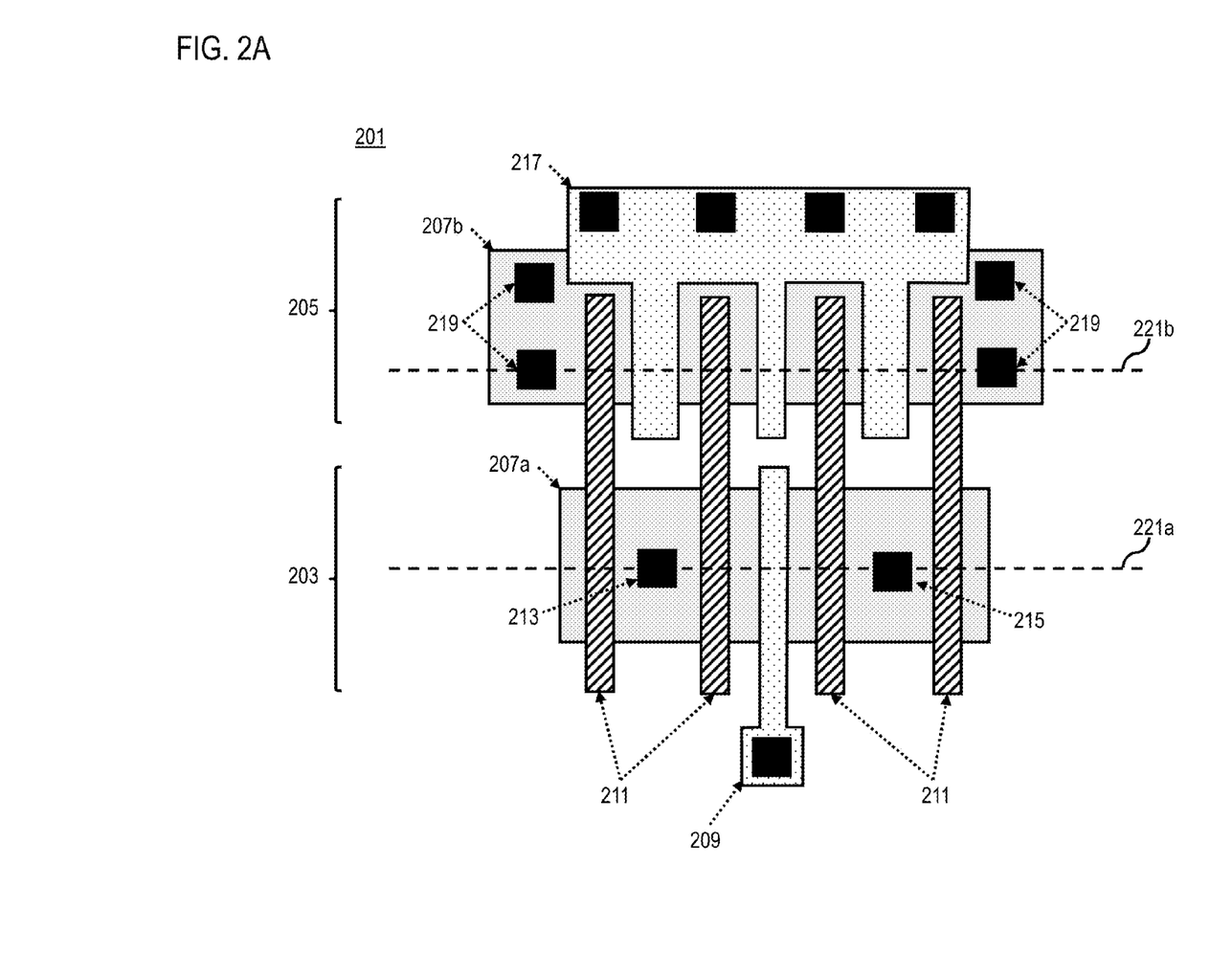
Figure 2B:
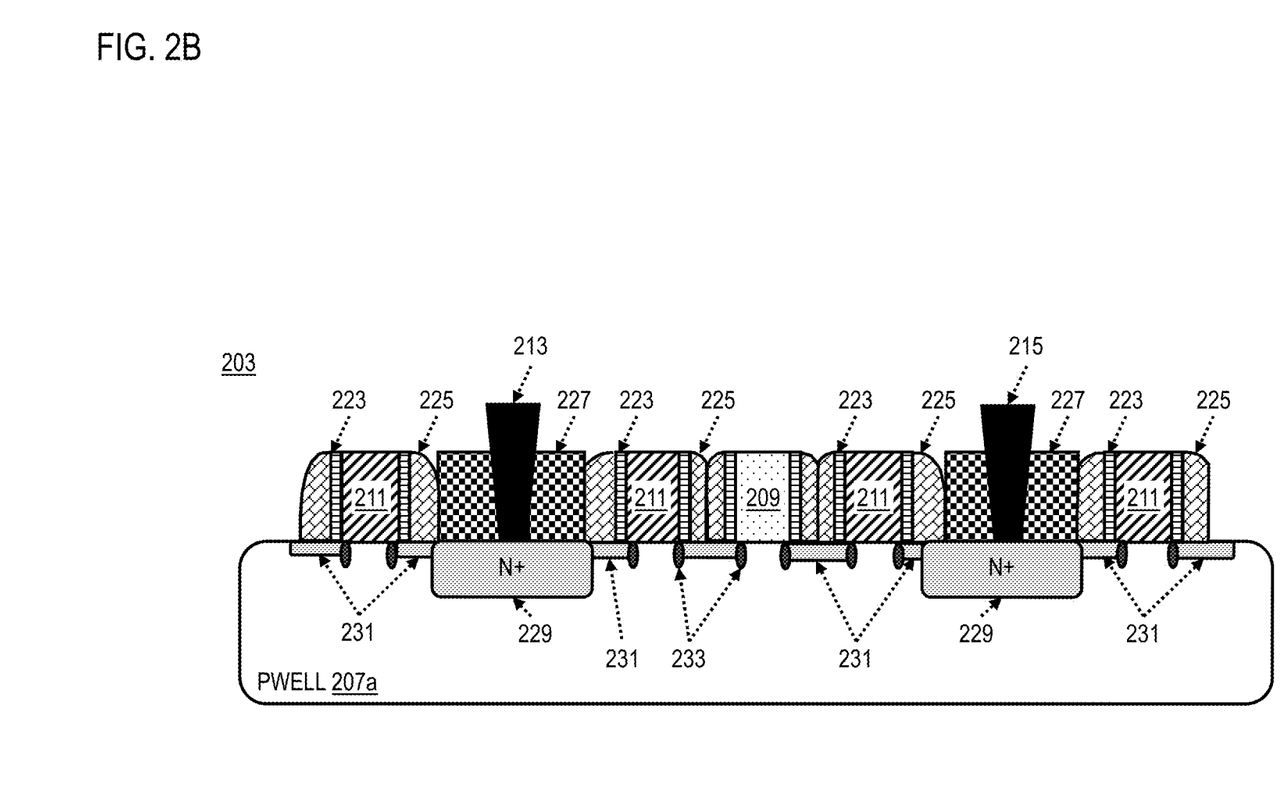
Figure 2C:
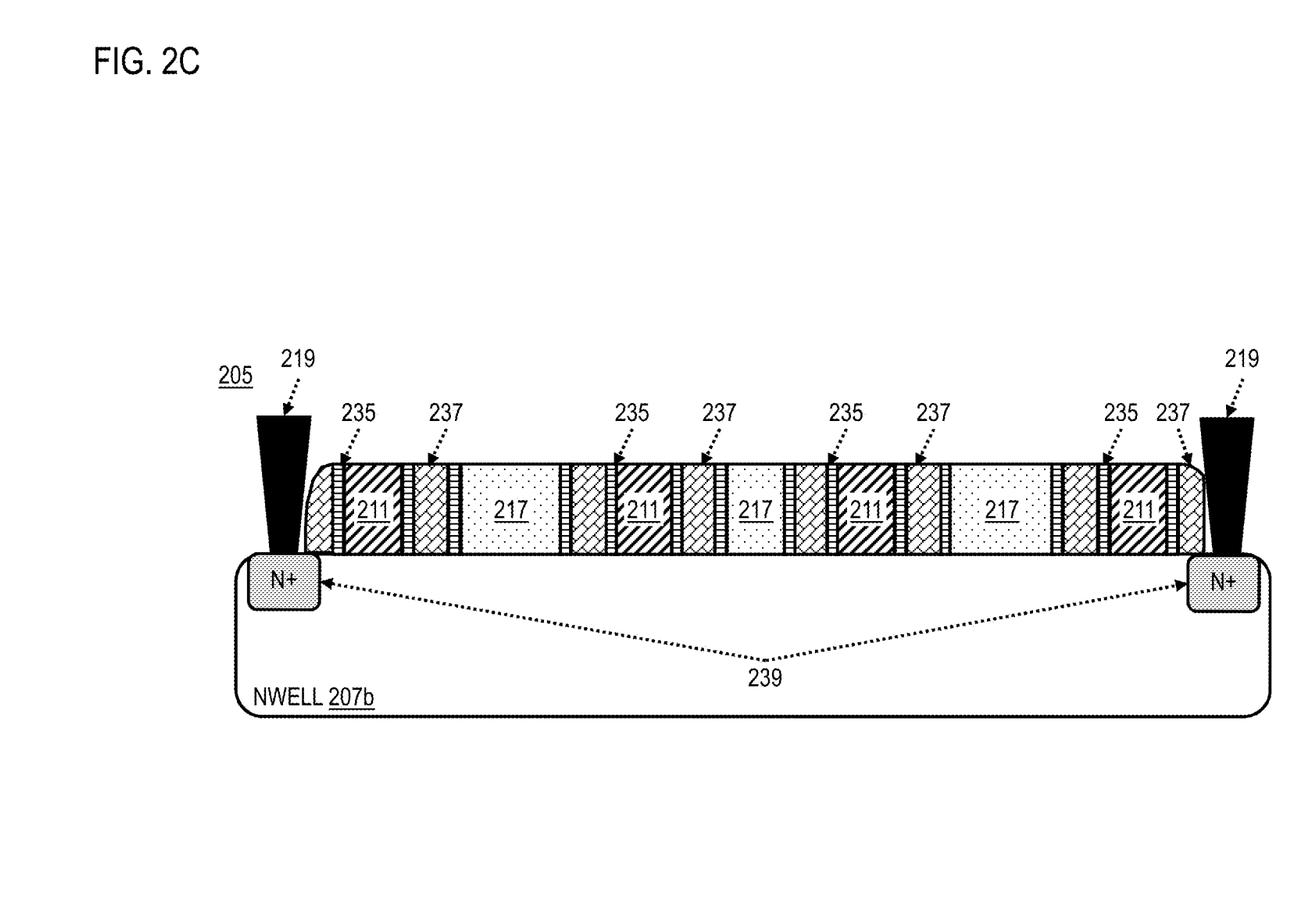

FIG. 2A schematically illustrates a layout view, and FIGS. 2B and 2C schematically illustrate cross-sectional views of a transistor and capacitor (based on cross-sectional indicators 221*a* and 221*b* of FIG. 2A), respectively, of a NVM cell with high bit density, in accordance with exemplary embodiments of the present disclosure. For example, FIG. 2A depicts memory cell 201 having transistor 203 (e.g., NMOS transistor) and capacitor 205 (e.g., MOS capacitor) respectively over well regions 207a and 207b in a substrate. Memory cell 201 may also include an STI region to separate transistor 203 from capacitor 205 (not shown for illustrative convenience). As shown in FIGS. 2A and 2B, transistor 203 may include wordline gate structure 209 and floating gate structures 211 over well region 207a, along with bitlines 213 and 215 connected to respective diffusion regions 229 (e.g., N+ doped diffusion regions for source/drain or bitline contacts) in well region 207a.

As illustrated in FIGS. 2A and 2C, capacitor 205 may include floating gate structures 211 and control gate structure (or structures) 217 between floating gate structures 211 over well region 207b, along with terminals 219 connected to diffusion regions 239 in well region 207b. In this way, memory cell 201 and cell arrays based on memory cell 201 may be significantly smaller (e.g., at least three times smaller in size) with twice the bit density (e.g., since memory cell 201 includes two bitlines 213 and 215 over well region 207a), compared with typical memory cells. In addition, the particular configuration of memory cell 201 enables faster write and erase operations, and does not require the use of LDMOS devices. Furthermore, as explained below, memory cell 201 offers improved reliability due to minimized gate oxide stress on capacitor 205 during write and erase operations.

As further depicted in FIG. 2B, transistor 203 may include spacer pairs 223 and 225 at opposite sides of wordline gate structure 209 and each floating gate structure 211. Also, transistor 203 includes dielectric regions 227 around bitlines 213 and 215. Spacers 223 may be formed of a nitride such as silicon nitride, and spacers 225 may be formed of an oxide such as silicon dioxide. Moreover, transistor 203 may include diffusion regions 229 (e.g., N+ doped diffusion regions for source/drain or bitline contacts) in well region 207a that are connected to bitlines 213 and 215. Further, source/drain extension regions 231 may extend under spacers 223 and 225, ending at halo implant regions 233 under each edge of wordline gate structure 209 and each floating gate structure 211. As shown in FIG. 2C, capacitor 205 may include spacer pairs 235 and 237 at opposite sides of each floating gate structure 211 and each control gate structure 217. Spacers 235 may be formed of a nitride such as silicon nitride, and spacers 237 may be formed of an oxide such as silicon dioxide. In addition, capacitor 205 may include diffusion regions 239 in well region 207b that are connected to terminals 219.

Figure 3A:
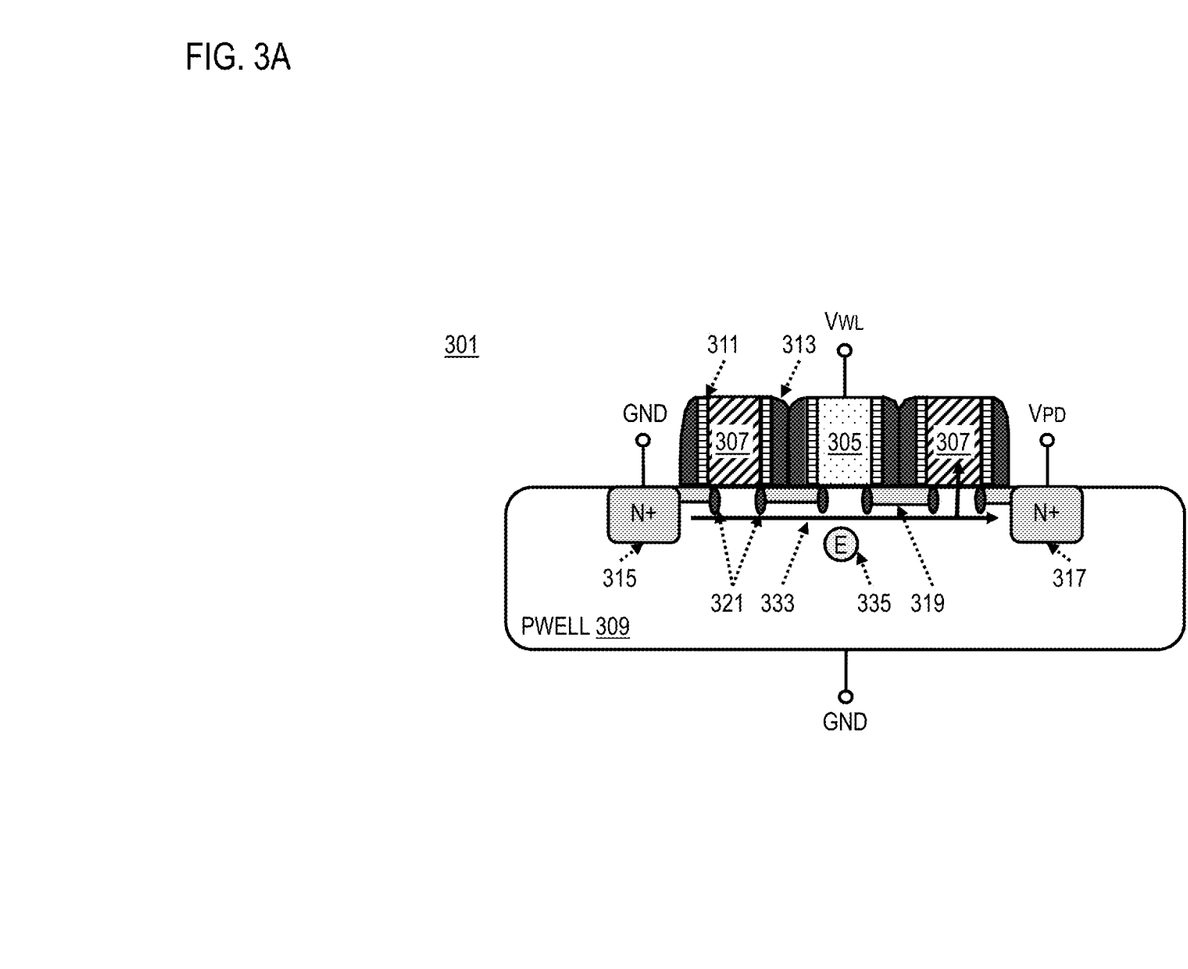
FIGS. 3A and 3B, 3C and 3D, and 3E and 3F schematically illustrate write and erase operations of a NVM cell with high bit density at the transistor and capacitor thereof, respectively, in accordance with exemplary embodiments of the present disclosure.
Figure 3B:
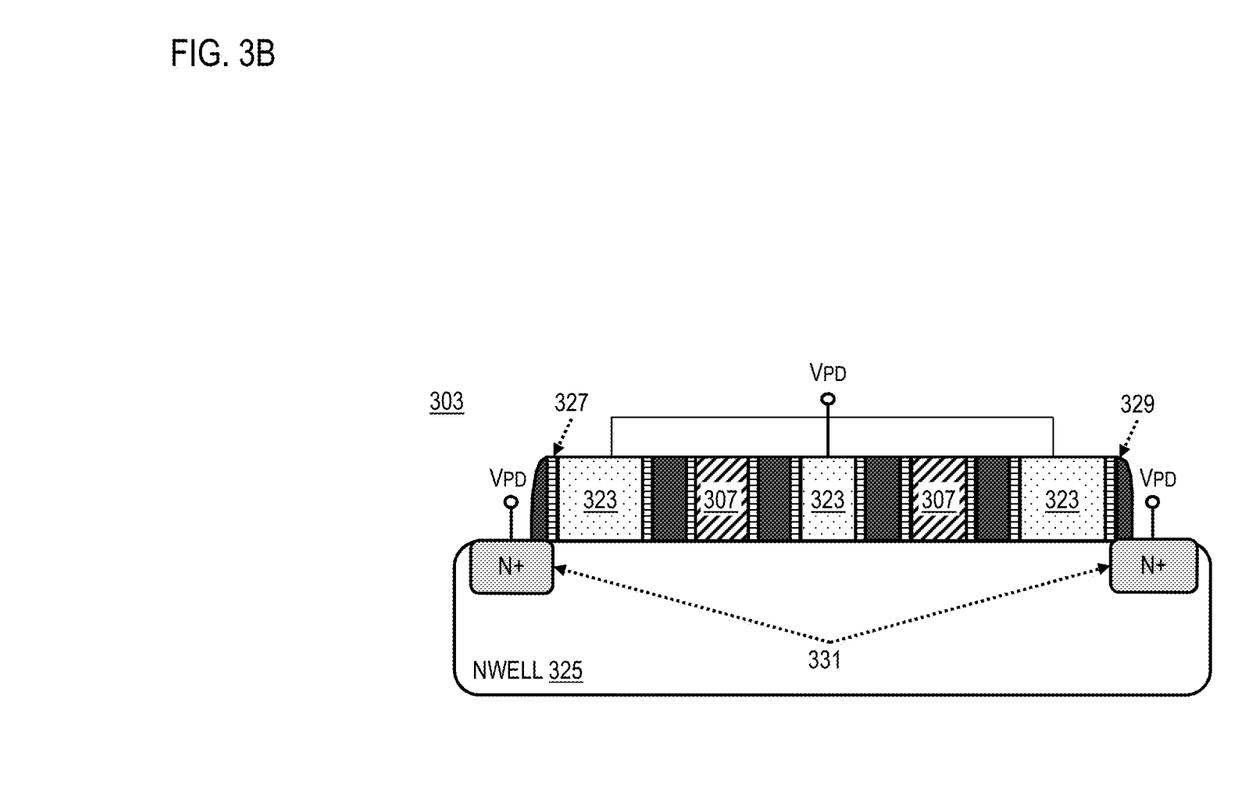
Figure 3C:
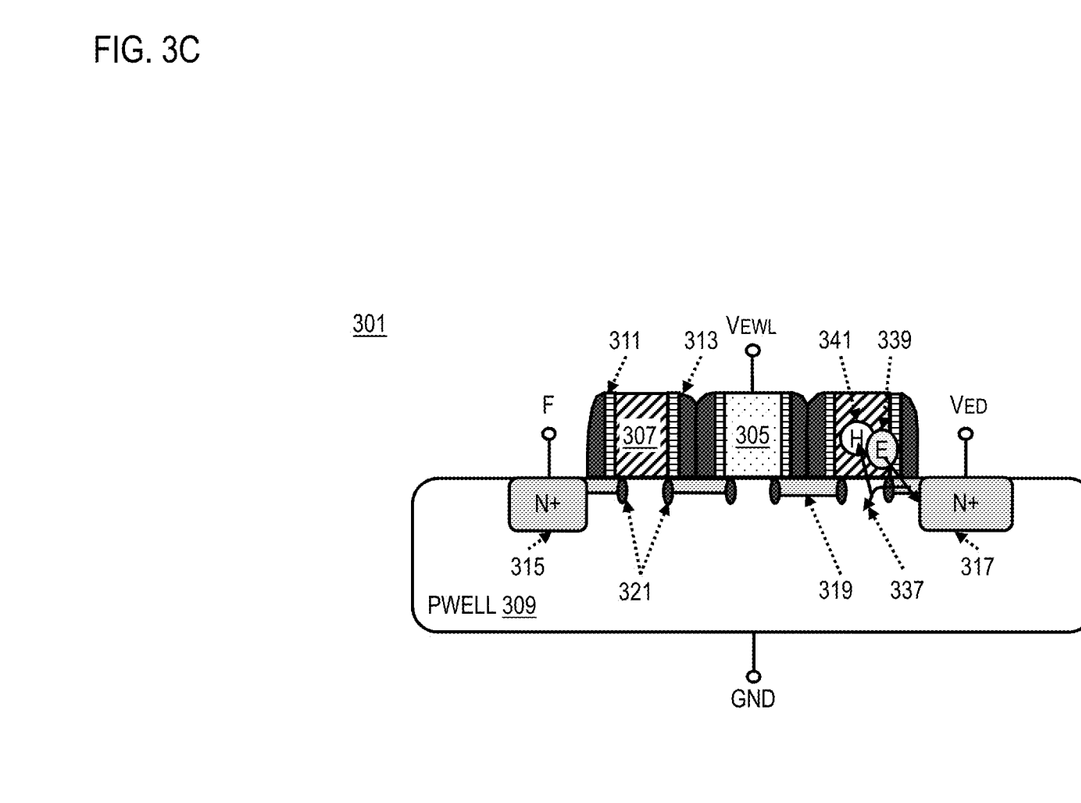
Figure 3D:
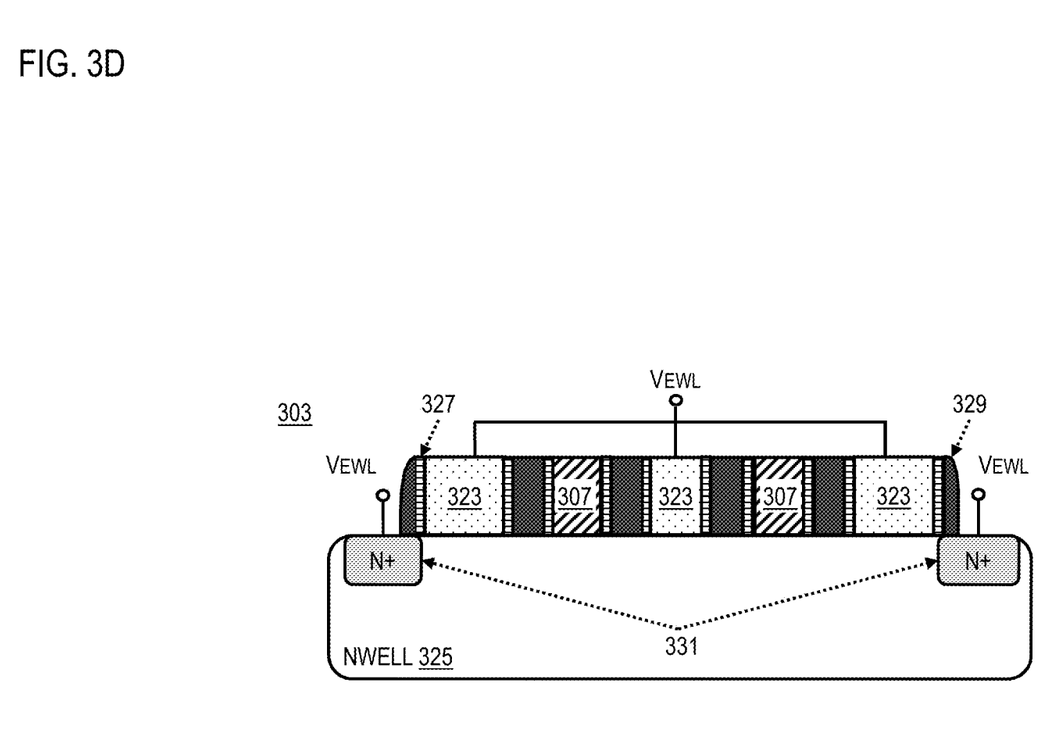

FIGS. 3A and 3B, 3C and 3D, and 3E and 3F schematically illustrate write and erase operations of a NVM cell with high bit density at the transistor and capacitor thereof, respectively, in accordance with exemplary embodiments of the present disclosure. As indicated, a memory cell may include a transistor and a capacitor (e.g., transistor 301 and capacitor 303 in FIGS. 3A and 3B, respectively). As shown in FIG. 3A, transistor 301 may include wordline gate structure 305 and floating gate structures 307 over well region 309, along with spacer pairs 311 and 313 at opposite sides of wordline gate structure 305 and each floating gate structure 307. In addition, well region 309 of transistor 301 may include diffusion regions 315 and 317 such that wordline gate structure 305 and floating gate structures 307 are laterally between diffusion regions 315 and 317. Well region 309 may also include source/drain extension regions 319 beneath spacers 311 and 313 and ending at halo implant regions 321 beneath edges of wordline gate structure 305 and floating gate structures 307. As illustrated in FIG. 3B, capacitor 303 may include control gate structures 323 and floating gate structures 307 over well region 325, spacer pairs 327 and 329 at opposite sides of each floating gate structure 307 and control gate structure 323, and diffusion regions 331 in well region 325.

As illustrated, in FIGS. 3A and 3B, write operations (e.g., via channel hot electron injection) associated with the memory cell may be enabled through components of transistor 301 and capacitor 303. For example, a positive bias may be applied to wordline gate structure 305 and to one of the bitlines (e.g., left or right) connected to diffusion regions 315 and 317 (shown as applied to the bitline connected to diffusion region 317), while a ground potential may be applied to the other one of the bitlines (e.g., by coupling that bitline to a ground rail), to create the condition for hot electron generation (e.g., as demonstrated by arrow 333 and electron indicator 335). Positive biasing of wordline gate structure 305 may, for instance, be performed by applying a positive wordline voltage to its gate terminal, and positive biasing of the bitline (e.g., left or right) may be performed by applying a positive programming drain voltage to the bitline. The wordline voltage and the programming drain voltage may, for example, be the same potential, or the wordline voltage and the programming drain voltage may be different potentials. Moreover, the positive bias applied to the bitline may also be applied to well region 325 (e.g., via terminals of diffusion regions 331) and to control gate structures 323. As such, the potential on floating gate structures 307 may be defined by capacitance coupling with the potential of the biased bitline, well region 325, and control gate structures 323. In addition, because the potential of well region 325 and control gate structures 323 have the same value during the write operation, the gate oxide stress on capacitor 303 will be minimized, resulting in improved reliability of the memory cell.

As shown, in FIGS. 3C and 3D, and 3E and 3F, erase operations (e.g., via Fowler-Nordheim (FN) tunneling) associated with the memory cell may be enabled through components of transistor 301 and capacitor 303. For example, in FIGS. 3C and 3D, FN tunneling from the right floating gate structure 307 to diffusion region 317 (e.g., as demonstrated by arrows 337, electron indicator 339, and hole indicator 341) may be performed by negatively biasing wordline gate structure 305, control gate structures 323, and well region 325 (e.g., via terminals of diffusion regions 331), positively biasing the bitline connected to diffusion region 317, and placing the other bitline connected to diffusion region 315 in a floating state. As depicted, the negative biasing may be provided by applying a negative erase wordline voltage to wordline gate structure 305, control gate structures 323, and well region 325, and the positive biasing may be provided by applying a positive erase drain voltage to the bitline connected to diffusion region 317. Similar to the write operation scenario, the gate oxide stress on capacitor 303 will be minimized, since the potential of well region 325 and control gate structures 323 have the same value during the erase operation, resulting in improved reliability of the memory cell.

Figure 3E:
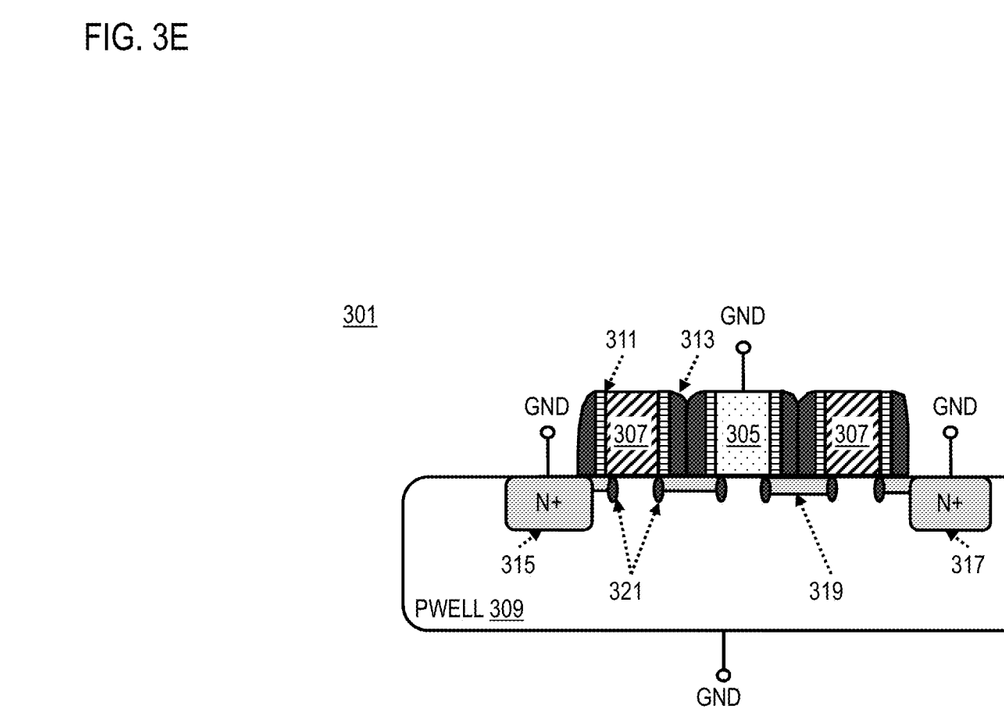
Figure 3F:
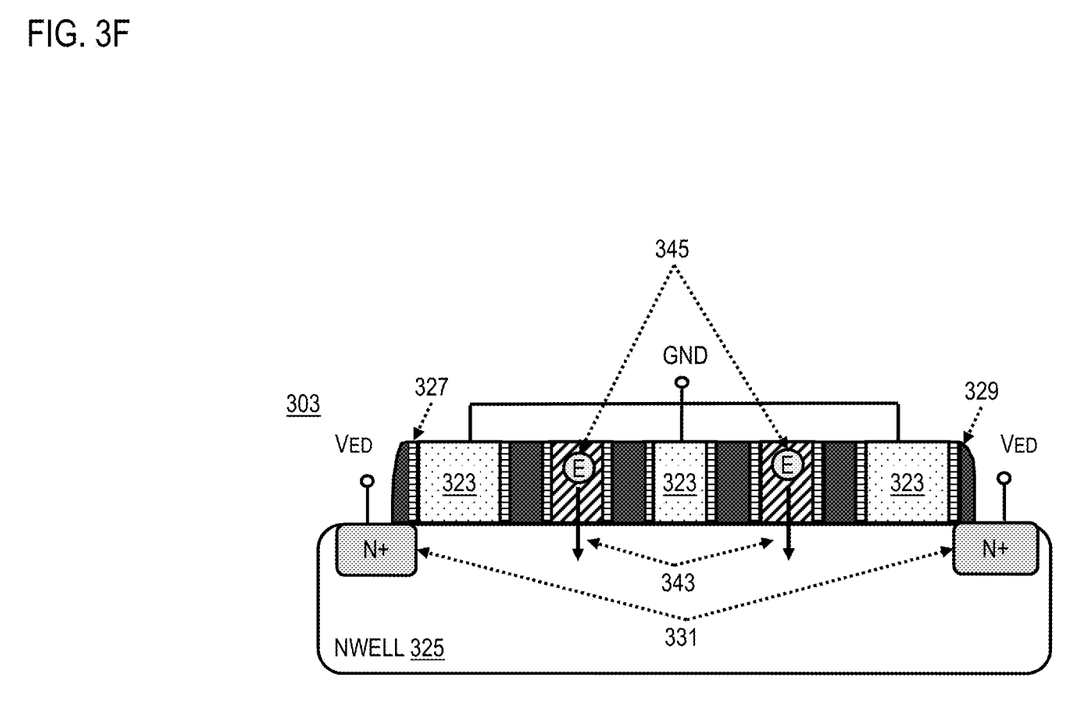

In FIGS. 3E and 3F, FN tunneling from floating gate structures 307 to well region 325 of the capacitor 303 (e.g., as demonstrated by arrows 343 and electron indicators 345) may be performed by applying a ground potential to wordline gate structure 305, bitlines of diffusion regions 315 and 317, and control gate structures 323 (e.g., by coupling these components to a ground rail), and positively biasing well region 325 (e.g., by applying a positive erase drain voltage to terminals of diffusion regions 331). Again, since the potential of well region 325 and control gate structures 323 have the same value during the erase operation, the gate oxide stress on capacitor 303 will be minimized, resulting in improved reliability of the memory cell.

The embodiments of the present disclosure can achieve several technical effects, including smaller memory cell size, fast write and erase operations, high bit density, no reliance on LDMOS integration, and improved reliability. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or any other devices utilizing logic or high-voltage technology nodes. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a transistor having a wordline gate structure over a substrate, first and second floating gate structures proximate opposite sides of the wordline gate structure, and first and second diffusion regions in the substrate, wherein the wordline gate structure, the first floating gate structure, and the second floating gate structure are laterally between the first and second diffusion regions; and
   providing a capacitor having first, second, and third control gate structures over the substrate, a third floating gate structure between the first and second control gate structures, a fourth floating gate structure between the second and third control gate structures, and third and fourth diffusion regions in the substrate, wherein the first, second, and third control gate structures are laterally between the third and fourth diffusion regions.

2. The method according to claim 1, further comprising:
   coupling the transistor and the capacitor via the first and third floating gate structures, and via the second and fourth floating gate structures.

3. The method according to claim 1, wherein the first floating gate structure is the third floating gate structure, and the second floating gate structure is the fourth floating gate structure.

4. The method according to claim 1, further comprising:
   providing a write operation by:
      positively biasing the wordline gate structure and one of the first and second diffusion regions;
      coupling another one of the first and second diffusion regions to a ground rail; and
      positively biasing the first, second, and third control gate structures, and the third and fourth diffusion regions.

5. The method according to claim 4, further comprising:
   positively biasing the one of the first and second diffusion regions, the first, second, and third control gate structures, and the third and fourth diffusion regions by applying a programming drain voltage to the one of the first and second diffusion regions, the first, second, and third control gate structures, and the third and fourth diffusion regions.

6. The method according to claim 1, further comprising:
   providing an erase operation by:
      negatively biasing the wordline gate structure, the first, second, and third control gate structures, and the third and fourth diffusion regions;
      positively biasing one of the first and second diffusion regions; and
      floating another one of the first and second diffusion regions.

7. The method according to claim 6, further comprising:
   negatively biasing the wordline gate structure, the first, second, and third control gate structures, and the third and fourth diffusion regions by applying an erase wordline voltage to the wordline gate structure, the first, second, and third control gate structures, and the third and fourth diffusion regions; and
   positively biasing the one of the first and second diffusion regions by applying an erase drain voltage to the one of the first and second diffusion regions.

8. The method according to claim 1, further comprising:
   providing an erase operation by:
      coupling the wordline gate structure, the first, second, and third control gate structures, and the first and second diffusion regions to a ground rail; and
      positively biasing the third and fourth diffusion regions.

9. A device comprising:
   a transistor having a wordline gate structure over a substrate, first and second floating gate structures proximate opposite sides of the wordline gate structure, and first and second diffusion regions in the substrate, wherein the wordline gate structure, the first floating gate structure, and the second floating gate structure are laterally between the first and second diffusion regions; and
   a capacitor having first, second, and third control gate structures over the substrate, a third floating gate structure between the first and second control gate structures, a fourth floating gate structure between the second and third control gate structures, and third and fourth diffusion regions in the substrate, wherein the first, second, and third control gate structures are laterally between the third and fourth diffusion regions.

10. The device according to claim 9, wherein the transistor is coupled to the capacitor via the first and third floating gate structures, and via the second and fourth floating gate structures.

11. The device according to claim 9, wherein the first floating gate structure is the third floating gate structure, and the second floating gate structure is the fourth floating gate structure.

12. The device according to claim 9, wherein the transistor and the capacitor are configured to provide a write operation via:
   positive biasing of the wordline gate structure and one of the first and second diffusion regions;
   coupling of another one of the first and second diffusion regions to a ground rail; and
   positive biasing of the first, second, and third control gate structures, and the third and fourth diffusion regions.

13. The device according to claim 9, wherein the transistor and the capacitor are configured to provide an erase operation via:
   negative biasing of the wordline gate structure, the first, second, and third control gate structures, and the third and fourth diffusion regions;
   positive biasing of one of the first and second diffusion regions; and floating of another one of the first and second diffusion regions.

14. The device according to claim 9, wherein the transistor and the capacitor are configured to provide an erase operation via:
coupling of the wordline gate structure, the first, second, and third control gate structures, and the first and second diffusion regions to a ground rail; and
positive biasing of the third and fourth diffusion regions.

15. The device according to claim 9, further comprising:
a shallow trench isolation (STI) region that separates the transistor and the capacitor;
a plurality of source/drain extension regions in the substrate laterally between the first and second diffusion regions;
a plurality of halo implant regions respectively proximate sides of the source/drain extension regions.

16. The device according to claim 9, further comprising:
a set of spacers between each of the wordline gate structure and the first floating gate structure, the wordline gate structure and the second floating gate structure, the first control gate structure and the third floating gate structure, the second control gate structure and the third floating gate structure, the second control gate structure and the fourth floating gate structure, and the third control gate structure and the fourth floating gate structure, wherein each set of spacers include one spacer that is formed of nitride, and another spacer that is formed of oxide.

17. A method comprising:
providing first and second floating gate structures over first and second well regions in a substrate;
providing a transistor having a wordline gate structure over the first well region, the first and second floating gate structures proximate opposite sides of the wordline gate structure, and first and second diffusion regions in the first well region, wherein the wordline gate structure, the first floating gate structure, and the second floating gate structure are laterally between the first and second diffusion regions; and
providing a capacitor having first, second, and third control gate structures over the second well region, the first floating gate structure between the first and second control gate structures, the second floating gate structure between the second and third control gate structures, and third and fourth diffusion regions in the second well region, wherein the first, second, and third control gate structures are laterally between the third and fourth diffusion regions.

18. The method according to claim 17, wherein the transistor and the capacitor are configured to provide a write operation via:
application of a positive wordline voltage to the wordline gate structure;
application of a positive programming drain voltage to one of the first and second diffusion regions;
coupling of another one of the first and second diffusion regions to a ground rail; and
application of the positive programming drain voltage to the first, second, and third control gate structures, and the third and fourth diffusion regions.

19. The method according to claim 18, wherein the transistor and the capacitor are further configured to provide an erase operation via:
application of a negative erase wordline voltage to the wordline gate structure, the first, second, and third control gate structures, and the third and fourth diffusion regions;
application of a positive erase drain voltage to the one of the first and second diffusion regions; and
floating of the other one of the first and second diffusion regions.

20. The method according to claim 19, wherein the transistor and the capacitor are further configured to provide another erase operation via:
coupling of the wordline gate structure, the first, second, and third control gate structures, and the first and second diffusion regions to the ground rail; and
application of a positive erase drain voltage to the third and fourth diffusion regions.

* * * * *